United States Patent

Jänker et al.

Patent Number: 5,811,911
Date of Patent: Sep. 22, 1998

[54] PIEZOELECTRIC ACTUATOR

[75] Inventors: Peter Jänker, Garching; Frank Hermle, Müncen, both of Germany

[73] Assignee: Daimler-Benz AG, Germany

[21] Appl. No.: 744,951

[22] Filed: Nov. 7, 1996

[30] Foreign Application Priority Data

Nov. 7, 1995 [DE] Germany ............. 195 41 426.8

[51] Int. Cl.$^6$ .................................. H01L 41/08
[52] U.S. Cl. ............................. 310/332; 310/331
[58] Field of Search ........................ 310/328, 323, 310/330–332, 324

[56] References Cited

U.S. PATENT DOCUMENTS

| | | | |
|---|---|---|---|
| 2,714,642 | 8/1955 | Kinsley | 310/332 X |
| 3,360,664 | 12/1967 | Straube | 310/332 |
| 3,631,383 | 12/1971 | Zilinskas | 310/331 X |
| 3,663,933 | 5/1972 | Madison | 310/331 |
| 4,246,447 | 1/1981 | Vorie | 310/331 X |
| 4,536,862 | 8/1985 | Sullivan et al. | 310/331 |
| 4,601,539 | 7/1986 | Watanabe | 310/369 |
| 4,617,707 | 10/1986 | Mohaupt et al. | 29/25.35 |
| 4,927,084 | 5/1990 | Brardner et al. | 310/331 X |
| 5,132,582 | 7/1992 | Hayashi et al. | 310/323 |
| 5,255,972 | 10/1993 | Shirasu | 60/528 |
| 5,589,725 | 12/1996 | Haertling | 310/330 X |

FOREIGN PATENT DOCUMENTS 287813  10/1983  Germany.

OTHER PUBLICATIONS

Abstract of Japanese Patent JP 1–25583A, Jan. 27, 1989, K. Ayuzawa.
Abstract of Japanese Patent JP 63–318177A, Dec. 27, 1988, K. Ayuzawa.

*Primary Examiner*—Mark O. Budd
*Attorney, Agent, or Firm*—Evenson, McKeown, Edwards & Lenahan, P.L.L.C.

[57] ABSTRACT

The piezoelectric actuator consists of at least two disk-shaped congruent bending elements which each have a carrier plate made of a hard-elastic material with a layer of a piezoelectric material applied to one or both sides. Two bending elements respectively are connected with one another by way of at least two bending joints arranged on the circumference of the carrier plates.

1 Claim, 2 Drawing Sheets

PIEZOELECTRIC ACTUATOR

BACKGROUND AND SUMMARY OF THE INVENTION

This invention relates to a piezoelectric actuator of the type having at least two disk-shaped bending elements which are arranged coaxially above one another, each having a carrier plate made of a hard-elastic material with a layer made of a piezoelectric element applied to one or both sides.

In order for such actuators to transmit a force, the bending elements must be supported at the edges. However, firm clamping of the edge (for example, into a frame) is precluded in the case of larger lifts because of the resulting radial shortening of the bending element. For this reason, German patent document DD 287 813 A5, for example, discloses two oppositely curved bending elements which are connected by way of a distance ring on which the individual bending elements rest, without any radial fastening. However, such a double-disk bending element can exert only pressure forces; it can not exert tension forces. For this reason, corresponding to the above-mentioned patent document, several such double-disk bending elements are combined in a yoke-type housing, so that when a voltage is applied, one half of the bending elements operate against the other half (to which no voltage is applied). In this manner, both tension and pressure forces can be exerted; but only half of the bending elements respectively can be utilized for generating force.

It is an object of the present invention to provide a piezoelectric actuator of the above-mentioned type which is similarly suitable for both pressure and tension forces, is as stiff and free of play as possible, and can be used as an axial connection element.

This object is achieved by the piezoelectric actuator according to the invention, in which respective disk shaped congruent bending elements are joined by at least two bending joints situated at the periphery of the carrier plates. Such an actuator is capable of generating tension forces as well as pressure forces, and is also so stiff in the axial direction that it can be used as a connection element. The force output takes place along a line, specifically the center axis of the two bending elements. Because the frictional connection between the edge areas of the bending elements takes place by way of bending joints, with the simultaneous control of both bending elements and the same axial lift, the edge areas carry out the same radial movement. Therefore, despite the axially stiff connection of both disks, there is no radial warping.

Other objects, advantages and novel features of the present invention will become apparent from the following detailed description of the invention when considered in conjunction with the accompanying drawings.

BRIEF DESCRIPTION OF THE DRAWINGS

FIG. 1b is a top view of the schematic construction of the double-disk actuator of FIG. 1a.

DETAILED DESCRIPTION OF THE DRAWINGS

Figure 1A:
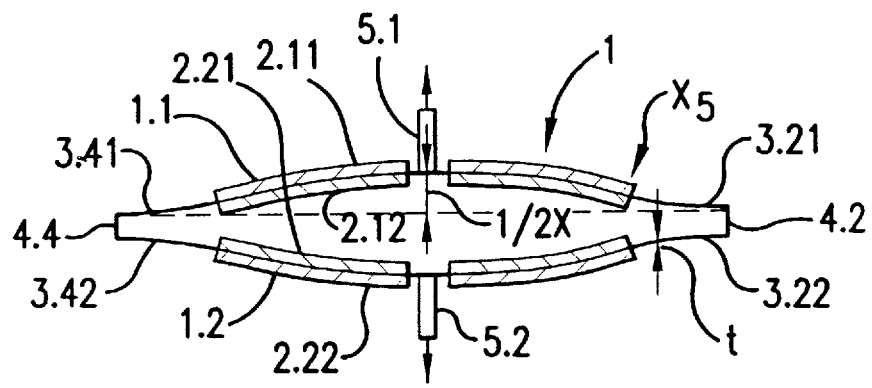
FIG. 1a is a cross-sectional view of a double disk piezoelectric actuator according to the invention.
Figure 1B:
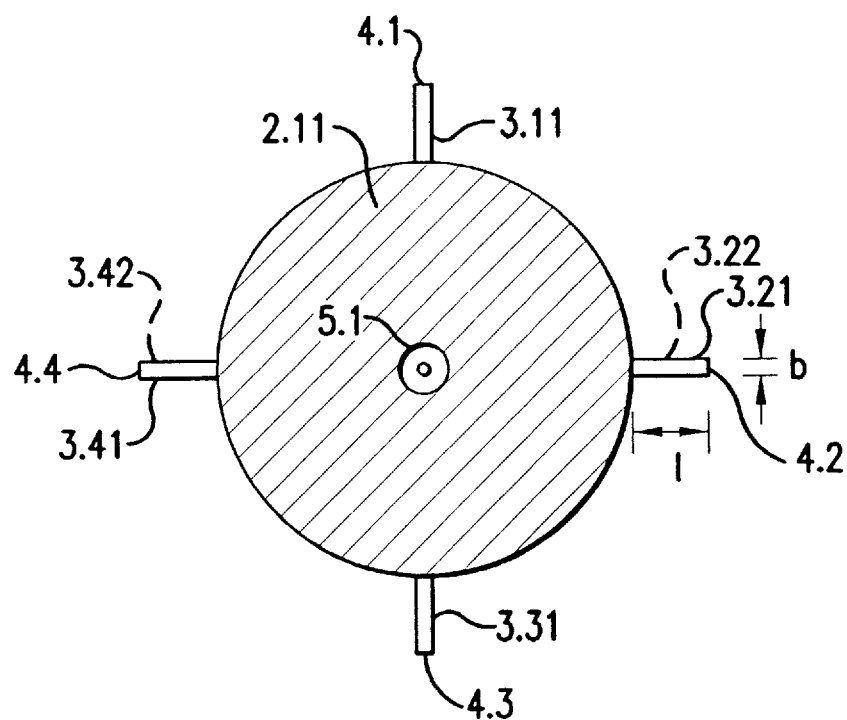

The double-disk actuator 1 illustrated in FIGS. 1a and 1b, has essentially two oppositely disposed congruent carrier plates 1.1 and 1.2, which may be made, for example, of steel plate. Piezoelectric layers 2.11, 2.12 and 2.21, 2.22 are applied to both sides of each of the plates 1.1 and 1.2, which may have a round construction (as shown) or may have other surface shapes. Each plate has four bending bars 3.11, 3.21, 3.31, 3.41 and 3.12, 3.22, 3.32, 3.42 which are distributed symmetrically along the circumference, and project from the edge in the radial direction. Respective pairs of opposing bending bars (e.g., 3.41 and 3.42, etc.) are rigidly connected to one another by way of axially extending webs 4.1 to 4.4. In place of such webs, of course, spacing of the bending elements may also be achieved by preforming the bending bars and directly connecting them with one another on the free ends in a rigid manner.

The bending bars 3.11 to 3.42 each have the same thickness t, width b and length l. (See FIGS. 1a and 1b.) In the case of a nominal lift x for the overall actuator, each bending element 1, 2 carries out a lift of ½ x, causing each bending bar 3.11 to 3.42 to deform to a contour defined by the path $x_s$. The output force F is transmitted by way of pressure and tension rods 5.1 and 5.2, which are fastened at the center axis of the respective carrier plates 1.1 and 1.2.

Where the bending bar material has a modulus of elasticity E, the individual bending bars are dimensioned according to the equation $$b = \frac{Fl^3}{nx_sEh^3}$$

where n is the number of joint connections, (in the illustrated case, therefore n=4), and F is the nominal force of the actuator.

Figure 2A:
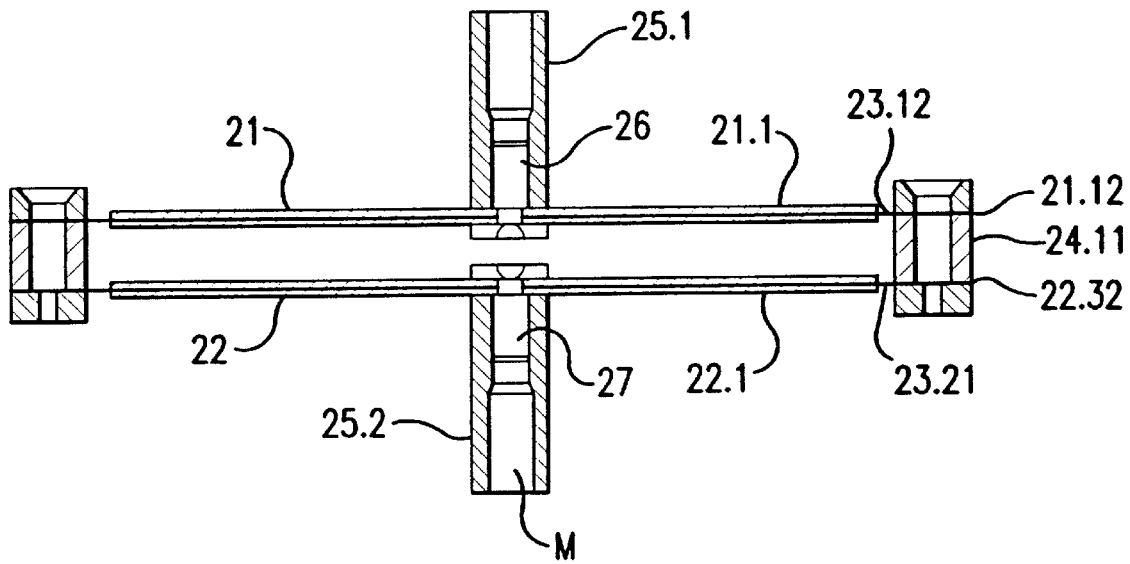
FIGS. 2a and 2b are more detailed views of the construction of a double-disk actuator according to the invention.

In the embodiment of a double-disk actuator illustrated in the cross-sectional view of FIG. 2a, two tube pieces 25.1 and 25.2 respectively are arranged at the centers of the respective bending elements 21 and 22. The bending elements comprise carrier plates 21.1 and 22.1, which are coated on both sides with piezoelectric material and are bonded correspondingly. The tube pieces 25.1 and 25.2 are connected with the bending elements 21 and 22 by means of a screwing-clamping connection 26 and 27, and are situated in a common axis M. This arrangement permits the use of the actuator as a connection element between two parts which can be displaced relative to one another, for example, a valve body and a sealing plate which closes and opens an opening.

Figure 2B:
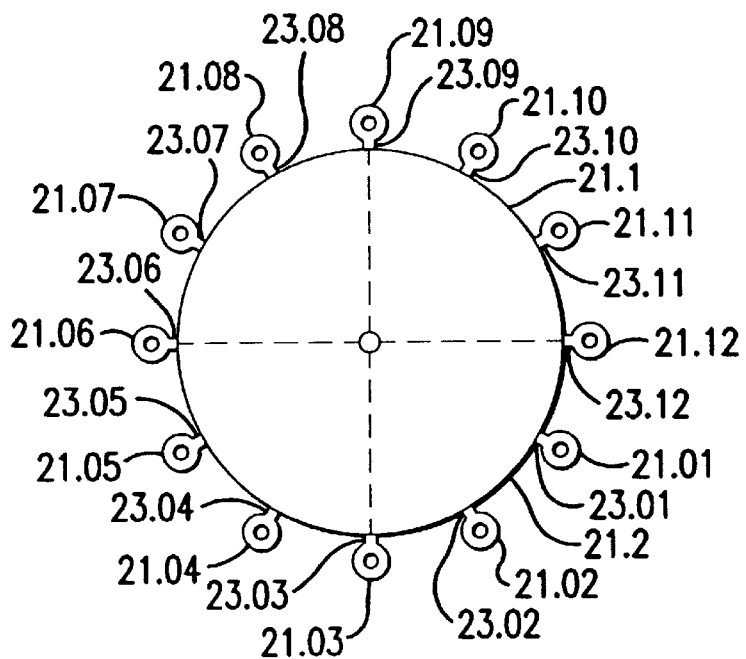

To provide the bending joints, as illustrated in a top view in FIG. 2b, each carrier plate 21.1 and 22.1 of the bending elements 21 and 22 has twelve fastening eyes 21.01–21.12 and 22.21–22.32 which are uniformly distributed along the circumference and are connected by means of connection webs 23.01–23.12 and 23.21–23.32 with the carrier plates 21.1 and 22.1. The fastening eyes and the connection webs are advantageously made of the same material as the carrier plate and can be produced, for example, by cutting or punching out of a disk.

The two bending elements 21 and 22 are now rigidly connected with one another by way of the fastening eyes 21.01–21.12 or 22.01–22.12 by way of distance sleeves 24.11 by means of screwing—clamping connections. In this manner, a piezoelectric actuator is obtained which has a low weight, a small size, a high operating capacity in the tension and pressure direction, short reaction times and a low energy requirement. For enlarging the nominal lift or the nominal force, several such actuators can be arranged and connected in a serial or parallel manner.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Piezoelectric actuator comprising:

at least two disk-shaped bending elements, arranged coaxially above one another, each of said bending elements including a carrier plate made of a hard-elastic material;

a layer of piezoelectric material applied to at least one side of each of said carrier plates; and at least two bending joints connecting said carrier plates, said bending Joints being arranged on the circumference of the carrier plates; wherein each of said bending joints comprises at least one bending bar and a rigid separator which is substantially perpendicular thereto;

said at least one bending bar comprises a lateral extension of a carrier plate, has a fastening eye coupled to a separator piece, and is dimensioned according to the equation $$b = \frac{Fl^3}{nx_sEh^3}$$

wherein b, l, h and E are the width, length, height and the modulus of elasticity of the bending bar, respectively;

F is the nominal force of the actuator;

$X_s$ is the deformation of a bending bar at the nominal lift x of the actuator with $X_s<0.2x$; and n is the number of bending joints between two bending elements.

* * * * *